(12) United States Patent
Lin et al.

(10) Patent No.: US 12,439,832 B2
(45) Date of Patent: Oct. 7, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hung-Chan Lin, Tainan (TW); Yu-Ping Wang, Hsinchu (TW); Chien-Ting Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/611,729

(22) Filed: Mar. 21, 2024

(65) Prior Publication Data

US 2024/0237554 A1    Jul. 11, 2024

Related U.S. Application Data

(63) Continuation of application No. 17/500,971, filed on Oct. 14, 2021, now Pat. No. 11,968,910.

(30) Foreign Application Priority Data

Sep. 13, 2021   (CN) .......................... 202111067661.2

(51) Int. Cl.
    *H10N 52/01*   (2023.01)
    *H10B 61/00*   (2023.01)
    *H10N 52/00*   (2023.01)
    *H10N 52/80*   (2023.01)

(52) U.S. Cl.
    CPC ............. *H10N 52/01* (2023.02); *H10B 61/00* (2023.02); *H10N 52/00* (2023.02); *H10N 52/80* (2023.02)

(58) Field of Classification Search
    CPC ........ H10N 52/01; H10N 52/00; H10N 52/80; H10N 59/00; H10N 50/01; H10N 50/10; H10B 61/00
    See application file for complete search history.

(56) References Cited

U.S. PATENT DOCUMENTS

| | | | |
|---|---|---|---|
| 9,230,626 B2 | 1/2016 | Buhrman et al. | |
| 2016/0351792 A1* | 12/2016 | Jiang | H10B 61/20 |
| 2020/0006424 A1* | 1/2020 | Sato | H10B 61/22 |
| 2020/0006634 A1 | 1/2020 | Brockman | |
| 2020/0006643 A1 | 1/2020 | Gosavi | |
| 2020/0075670 A1 | 3/2020 | Lin | |
| 2020/0161541 A1* | 5/2020 | Tseng | H10B 61/00 |
| 2020/0161542 A1* | 5/2020 | Ahn | H10N 50/10 |
| 2021/0098529 A1 | 4/2021 | Chuang | |
| 2021/0098693 A1 | 4/2021 | Chuang | |
| 2021/0384417 A1 | 12/2021 | Takahashi | |
| 2022/0392955 A1 | 12/2022 | Lin | |
| 2022/0393101 A1 | 12/2022 | Lee | |
| 2023/0040768 A1 | 2/2023 | Frougier | |
| 2023/0061985 A1 | 3/2023 | Chuang | |

* cited by examiner

*Primary Examiner* — Latanya N Crawford Eason
(74) *Attorney, Agent, or Firm* — Winston Hsu

(57) ABSTRACT

A semiconductor device includes a magnetic tunneling junction (MTJ) on a substrate, a first spin orbit torque (SOT) layer on the MTJ, a spacer adjacent to the MTJ and the first SOT layer, and a second SOT layer on the first SOT layer. Preferably, the first SOT layer and the second SOT layer are made of same material.

5 Claims, 7 Drawing Sheets

SEMICONDUCTOR DEVICE AND METHOD FOR FABRICATING THE SAME

CROSS REFERENCE TO RELATED APPLICATIONS

This application is a continuation application of U.S. application Ser. No. 17/500,971, filed on Oct. 14, 2021. The content of the application is incorporated herein by reference.

BACKGROUND OF THE INVENTION

1. Field of the Invention

The invention relates to a method for fabricating semiconductor device, and more particularly to a method for fabricating magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of: forming a magnetic tunneling junction (MTJ) stack on a substrate; forming an etch stop layer on the MTJ stack; forming a first spin orbit torque (SOT) layer on the etch stop layer; and patterning the first SOT layer, the etch stop layer, and the MTJ stack to form a MTJ.

According to another aspect of the present invention, a semiconductor device includes a magnetic tunneling junction (MTJ) on a substrate, a first spin orbit torque (SOT) layer on the MTJ, a spacer adjacent to the MTJ and the first SOT layer, and a second SOT layer on the first SOT layer.

According to yet another aspect of the present invention, a semiconductor device includes a magnetic tunneling junction (MTJ) on a substrate, a first spin orbit torque (SOT) layer on the MTJ, an etch stop layer between the MTJ and the first SOT layer, and a second SOT layer on the first SOT layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
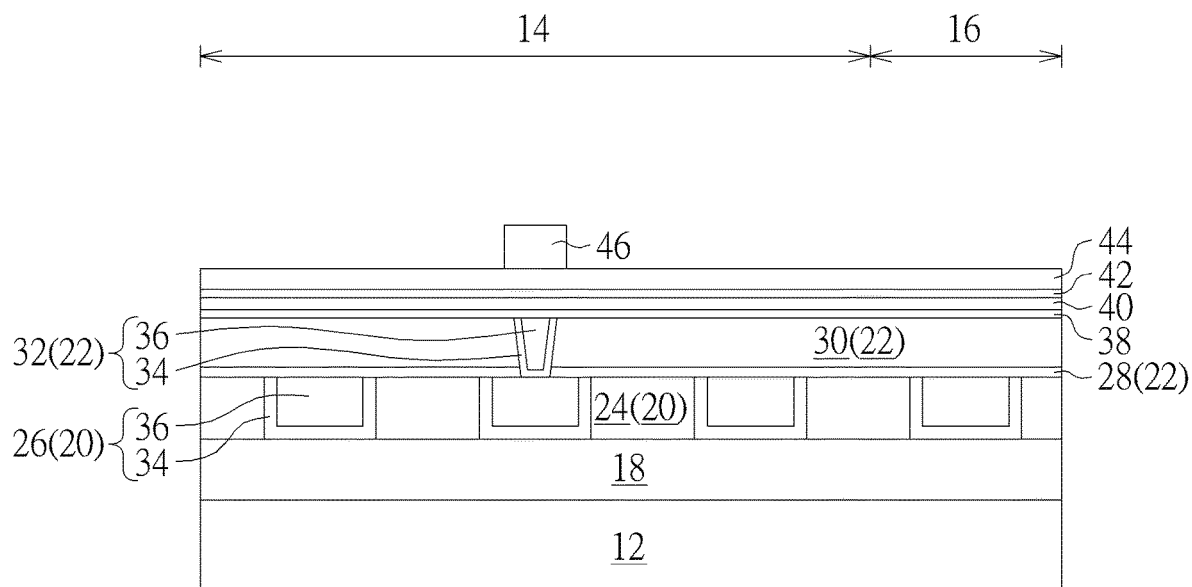
FIGS. 1-6 illustrate a method for fabricating a MRAM device according to an embodiment of the present invention.

Referring to FIGS. 1-6, FIGS. 1-6 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 26 are preferably made of copper, the metal layer 36 in the metal interconnections 32 is made of tungsten, the IMD layers 24, 30 are preferably made of silicon oxide such as tetraethyl orthosilicate (TEOS), and the stop layer 28 is preferably made of nitrogen doped carbide (NDC), silicon nitride, silicon carbon nitride (SiCN), or combination thereof.

Next, a bottom electrode 38, a MTJ stack 40 or stack structure, a top electrode 42, a first spin orbit torque (SOT) layer 44, and a patterned mask 46 are formed on the metal interconnect structure 22. In this embodiment, the formation of the MTJ stack 40 could be accomplished by sequentially depositing a pinned layer, a barrier layer, and a free layer on the bottom electrode 38. In this embodiment, the bottom electrode 38 and the top electrode 42 are preferably made of conductive material including but not limited to for example Ta, Pt, Cu, Au, Al, or combination thereof. The pinned layer could be made of ferromagnetic material including but not limited to for example iron, cobalt, nickel, or alloys thereof such as cobalt-iron-boron (CoFeB) or cobalt-iron (CoFe). Alternatively, the pinned layer could also be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The barrier layer could be made of insulating material including but not limited to for example oxides such as aluminum oxide ($AlO_x$) or magnesium oxide (MgO). The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field. Preferably, the first SOT layer 44 is serving as a channel for the MRAM device as the first SOT layer 44 could include metals such as tantalum (Ta), tungsten (W), platinum (Pt), or hafnium (Hf) and/or topological insulator such as bismuth selenide ($Bi_xSe_{1-x}$). The patterned mask 46 could include conductive or dielectric material including but not limited to for example TiN.

Figure 2:
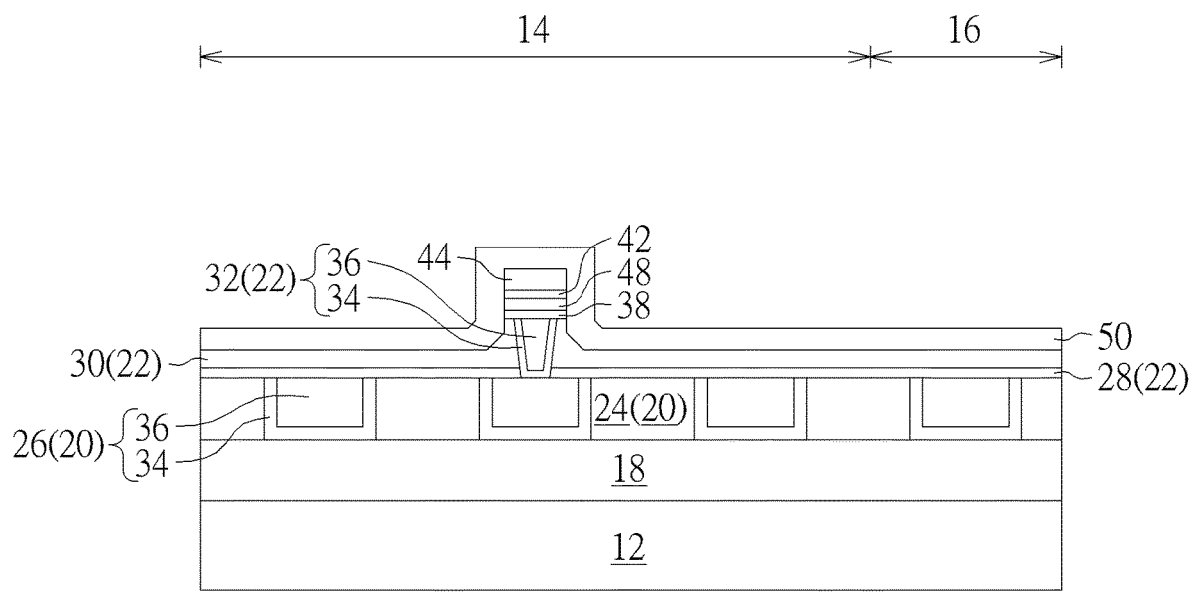

Next, as shown in FIGS. 1-2, one or more etching processes could be conducted by using the patterned mask 46 as mask to remove part of the first SOT layer 44, part of the top electrode 42, part of the MTJ stack 40, part of the bottom electrode 38, and part of the IMD layer 30 to form a MTJ 48 on the MRAM region 14, and the patterned mask 46 is removed thereafter. It should be noted that a reactive ion etching (RIE) and/or an ion beam etching (IBE) process is conducted to remove the top electrode 42, MTJ stack 40, bottom electrode 38, and the IMD layer 30 in this embodiment for forming the MTJ 48. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJ 48.

Next, a cap layer 50 is formed on the MTJ 48 while covering the surface of the IMD layer 30. In this embodiment, the cap layer 50 preferably includes silicon nitride, but could also include other dielectric material including but not limited to for example silicon oxide, silicon oxynitride (SiON), or silicon carbon nitride (SiCN).

Figure 3:
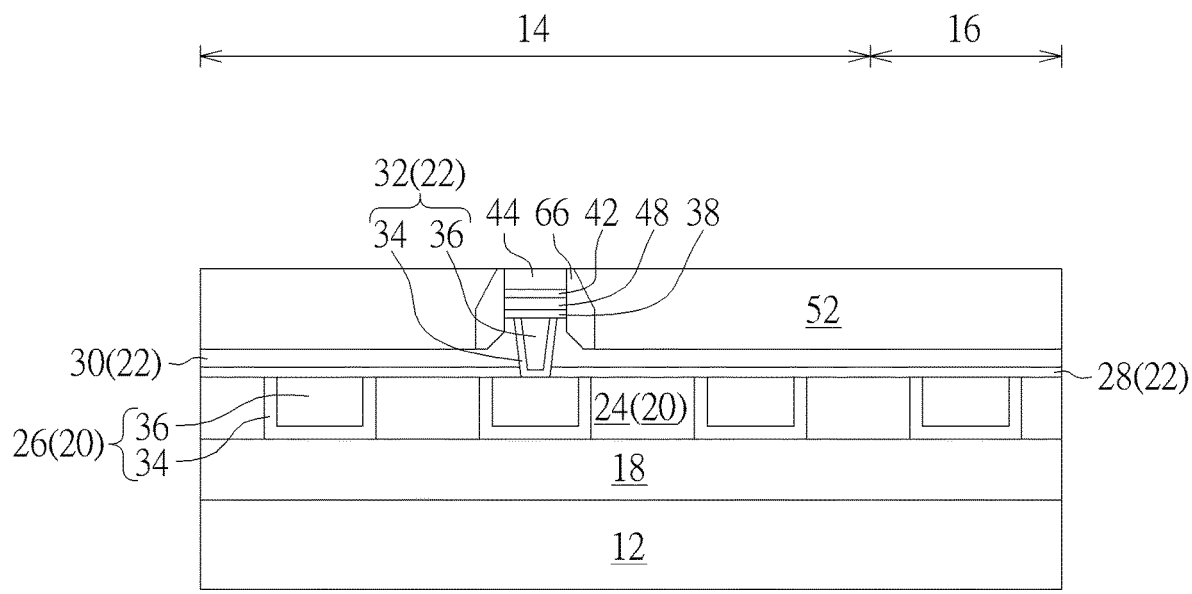

Next, as shown in FIG. 3, an etching process is conducted without using any patterned mask such as patterned resist to remove part of the cap layer 50 for forming a spacer 66 around or adjacent to sidewalls of the MTJ 48 and the first SOT layer 44, in which the spacer 66 preferably includes an I-shape in a cross-section view. Next, a deposition process such as an atomic layer deposition (ALD) process is conducted to form an IMD layer 52 on the first SOT layer 44, the spacer 66, and the IMD layer 30, and then a planarizing process such as a chemical mechanical polishing (CMP) or etching back process is conducted to remove part of the IMD layer 52 so that the top surface of the remaining IMD layer 52 is even with the top surface of the first SOT layer 44.

Figure 4:
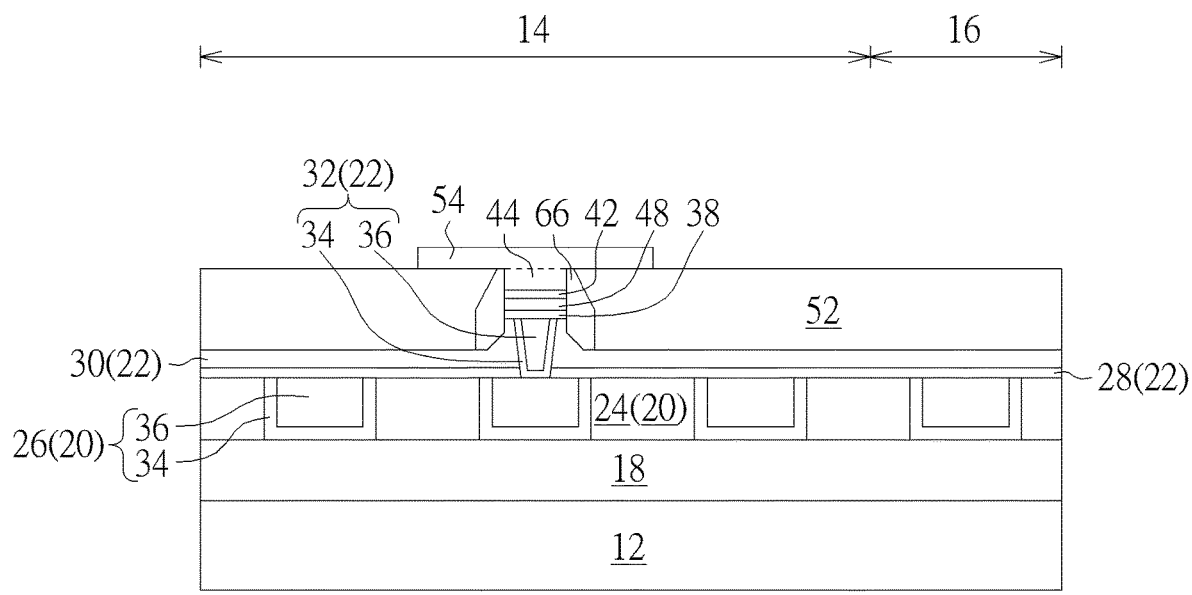

Next, as shown in FIG. 4, a second SOT layer 54 is formed on the surface of the first SOT layer 44 and the IMD layer 52. Next, a pattern transfer or photo-etching process is conducted by using a patterned mask (not shown) as mask to remove part of the second SOT layer 54 on the IMD layer 52 as the remaining second SOT layer 54 is still disposed on the IMD layer 52 adjacent to two sides of first SOT layer 44. In this embodiment, the first SOT layer 44 and the second SOT layer 54 are preferably made of same material, in which the second SOT layer 54 also serves as the channel for MRAM device and the second SOT layer 54 could include metals such as tantalum (Ta), tungsten (W), platinum (Pt), or hafnium (Hf) and/or topological insulator such as bismuth selenide ($Bi_x$—$Se_{1-x}$).

Figure 5:
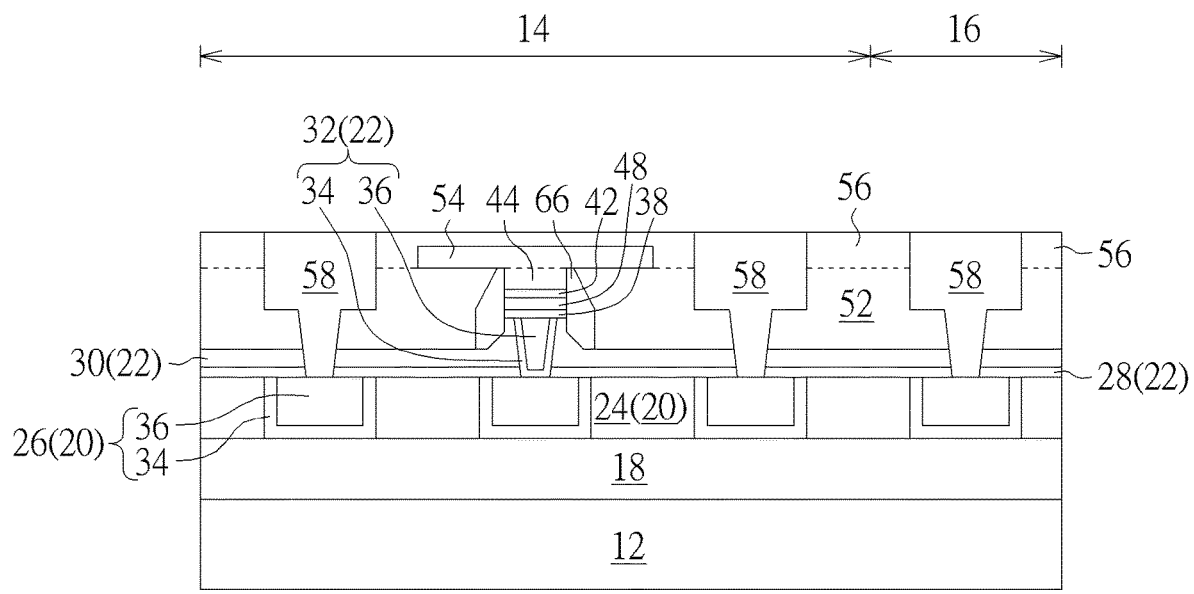

Next, as shown in FIG. 5, another IMD layer 56 is formed on the second SOT layer 54 and the IMD layer 52, in which the IMD layer 56 is preferably formed conformally on the second SOT layer 54. In this embodiment, each of the IMD layer 52 and IMD layer 56 preferably includes an ultra low-k (ULK) dielectric layer including but not limited to for example porous material or silicon oxycarbide (SiOC) or carbon doped silicon oxide (SiOCH). Next, a planarizing process such as chemical mechanical polishing (CMP) process or etching back process is conducted to remove part of the IMD layer 56 while the top surface of the remaining IMD layer 56 is still higher than the top surface of the second SOT layer 54.

Next, a pattern transfer process is conducted by using a patterned mask (not shown) to remove part of the IMD layer 56, part of the IMD layer 52, part of the IMD layer 30, and part of the stop layer 28 on the MRAM region 14 and logic region 16 to form contact holes (not shown) exposing the metal interconnections 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the conductive materials including the aforementioned barrier layer and metal layer to form metal interconnections 58 in the contact holes electrically connecting the metal interconnections 26.

Figure 6:
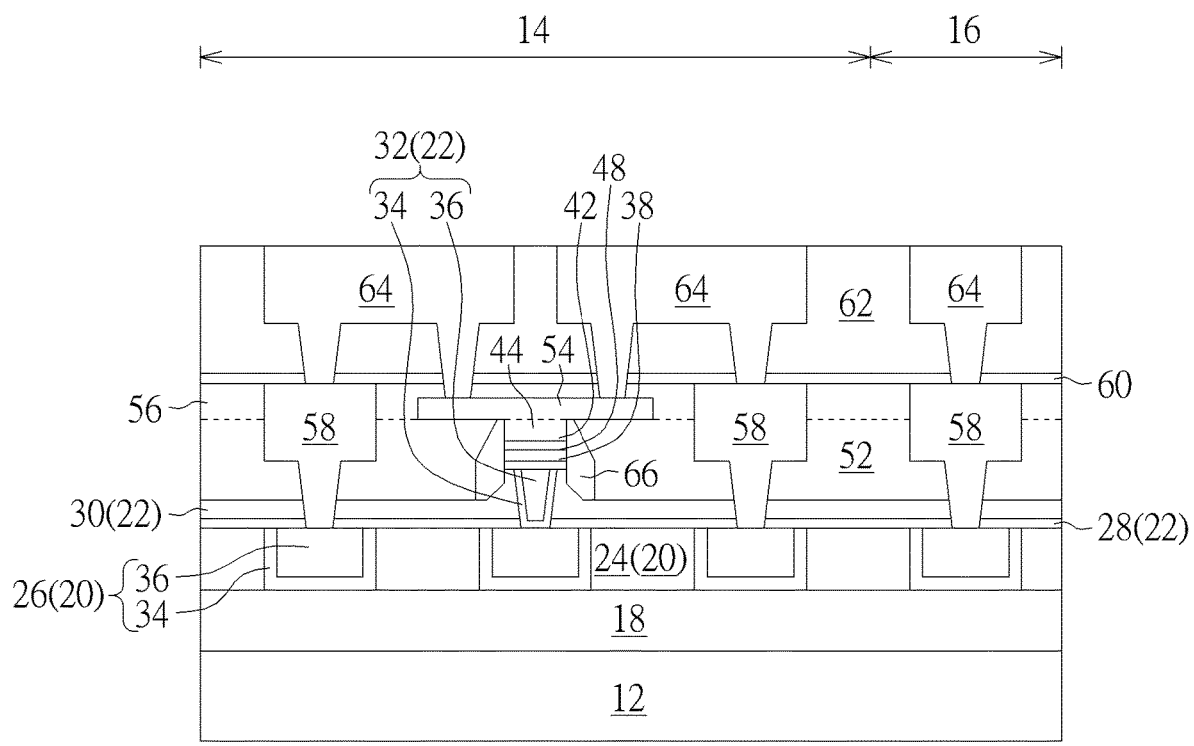

Next, as shown in FIG. 6, a stop layer 60 is formed on the MRAM region 14 and logic region 16 to cover the IMD layer 56 and metal interconnections 58, an IMD layer 62 is formed on the stop layer 60, and one or more photo-etching process is conducted to remove part of the IMD layer 62, part of the stop layer 60, and part of the IMD layer 56 on the MRAM region 14 and logic region 16 to form contact holes (not shown). Next, conductive materials are deposited into each of the contact holes and a planarizing process such as CMP is conducted to form metal interconnections 64 connecting the MTJ 48 and metal interconnections 58 underneath, in which the metal interconnections 64 on the MRAM region 14 directly contacts the second SOT layer 54 underneath while the metal interconnections 64 on the logic region 16 directly contacts the metal interconnections 58 on the lower level.

In this embodiment, the stop layers 60 and 28 could be made of same or different materials, in which the two layers 60, 28 could all include nitrogen doped carbide (NDC), silicon nitride, silicon carbon nitride (SiCN), or combination thereof. Similar to the metal interconnections formed previously, each of the metal interconnections 64 could be formed in the IMD layer 62 through a single damascene or dual damascene process. For instance, each of the metal interconnections 64 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Figure 7:
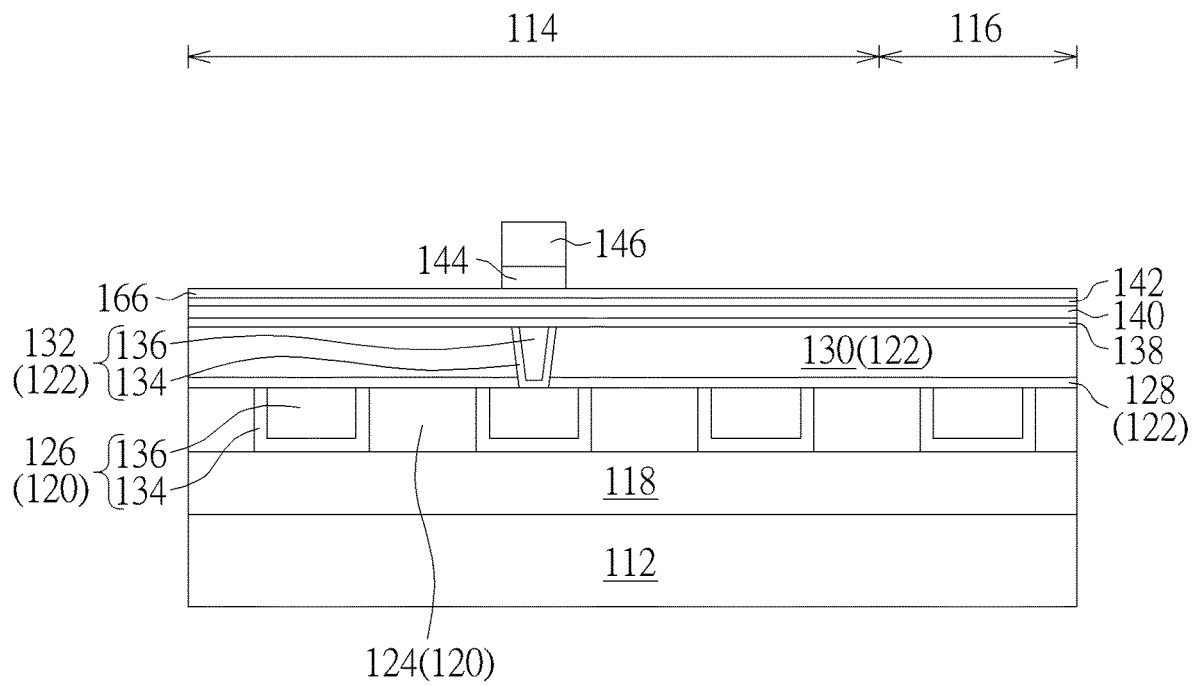
FIGS. 7-12 illustrate a method for fabricating a MRAM device according to an embodiment of the present invention.

Referring to FIGS. 7-12, FIGS. 7-12 illustrate a method for fabricating a MRAM device according to an embodiment of the present invention. As shown in FIG. 7, a substrate 112 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 114 and a logic region 116 are defined on the substrate 112.

Active devices such as metal-oxide semiconductor (MOS) transistors, passive devices, conductive layers, and interlayer dielectric (ILD) layer 118 could also be formed on top of the substrate 112. More specifically, planar MOS transistors or non-planar (such as FinFETs) MOS transistors could be formed on the substrate 112, in which the MOS transistors could include transistor elements such as gate structures (for example metal gates) and source/drain region, spacer, epitaxial layer, and contact etch stop layer (CESL). The ILD layer 118 could be formed on the substrate 112 to cover the MOS transistors, and a plurality of contact plugs could be formed in the ILD layer 118 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 120, 122 are sequentially formed on the ILD layer 118 on the MRAM region 114 and the logic region 116 to electrically connect the aforementioned contact plugs, in which the metal interconnect structure 120 includes an inter-metal dielectric (IMD) layer 124 and metal interconnections 126 embedded in the IMD layer 124, and the metal interconnect structure 122 includes a stop layer 128, an IMD layer 130, and metal interconnections 132 embedded in the stop layer 128 and the IMD layer 130.

In this embodiment, each of the metal interconnections 126 from the metal interconnect structure 120 preferably includes a trench conductor and the metal interconnection 132 from the metal interconnect structure 122 on the MRAM region 114 includes a via conductor. Preferably, each of the metal interconnections 126, 132 from the metal interconnect structures 120, 122 could be embedded within the IMD layers 124, 130 and/or stop layer 128 according to a single damascene process or dual damascene process. For instance, each of the metal interconnections 126, 132 could further include a barrier layer 134 and a metal layer 136, in which the barrier layer 134 could be selected from the group consisting of titanium (Ti), titanium nitride (TiN), tantalum (Ta), and tantalum nitride (TaN) and the metal layer 136 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 136 in the metal interconnections 126 are preferably made of copper, the metal layer 136 in the metal interconnections 132 is made of tungsten, the IMD layers 124, 130 are preferably made of silicon oxide such as tetraethyl orthosilicate (TEOS), and the stop layer 128 is preferably made of nitrogen doped carbide (NDC), silicon nitride, silicon carbon nitride (SiCN), or combination thereof.

Next, a bottom electrode 138, a MTJ stack 140 or stack structure, a top electrode 142, an etch stop layer 166, a first spin orbit torque (SOT) layer 144, and a patterned mask 146 are formed on the metal interconnect structure 122. In this embodiment, the formation of the MTJ stack 140 could be accomplished by sequentially depositing a pinned layer, a barrier layer, and a free layer on the bottom electrode 138. In this embodiment, the bottom electrode 138 and the top electrode 142 are preferably made of conductive material including but not limited to for example Ta, Pt, Cu, Au, Al, or combination thereof. The pinned layer could be made of ferromagnetic material including but not limited to for example iron, cobalt, nickel, or alloys thereof such as cobalt-iron-boron (CoFeB) or cobalt-iron (CoFe). Alternatively, the pinned layer could also be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The barrier layer could be made of insulating material including but not limited to for example oxides such as aluminum oxide ($AlO_x$) or magnesium oxide (MgO). The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field. Preferably, the etch stop layer 166 is preferably made of metal such as ruthenium (Ru) and the first SOT layer 144 is serving as a channel for the MRAM device as the first SOT layer 144 could include metals such as tantalum (Ta), tungsten (W), platinum (Pt), or hafnium (Hf) and/or topological insulator such as bismuth selenide ($B_xSe_{1-x}$). The patterned mask 146 could include conductive or dielectric material including but not limited to for example TiN.

Figure 8:
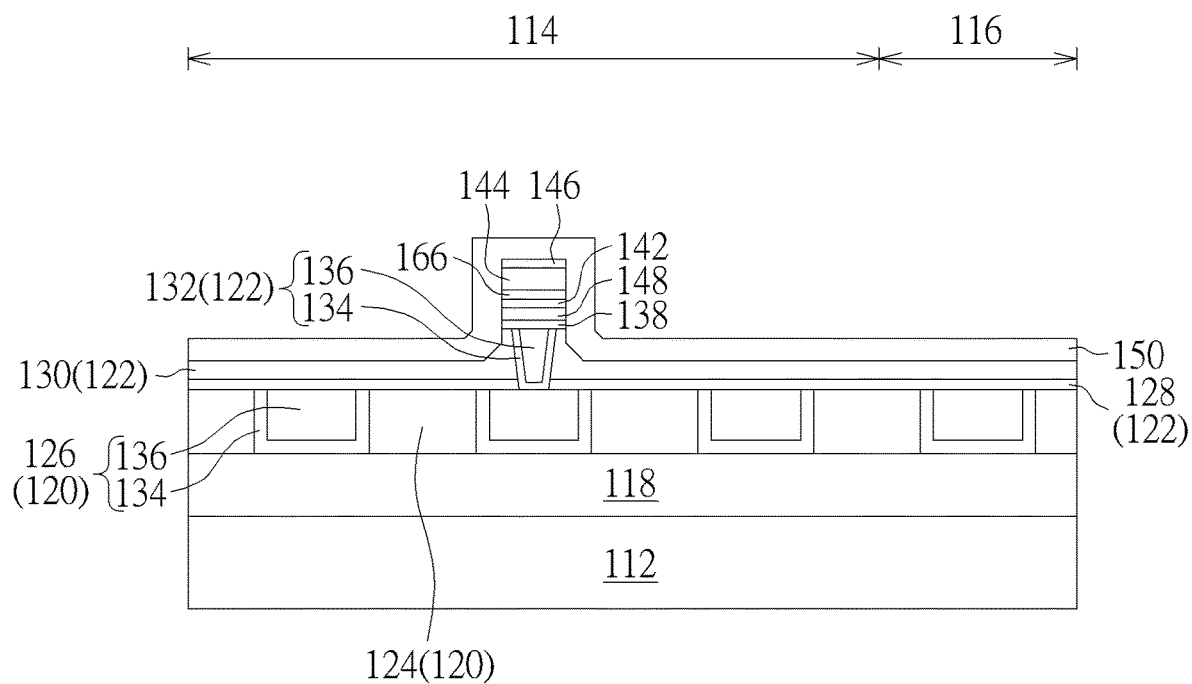

Next, as shown in FIGS. 7-8, a reactive ion etching (RIE) process could be conducted by using the patterned mask 146 as mask to remove part of the first SOT layer 144 to expose the surface of the etch stop layer 166, in which the etch stop layer 166 preferably prevents etching gas from damaging the magnetic material in the MTJ stack 140 underneath during the RIE process. Next, another etching process such as an ion beam etching (IBE) process is conducted to remove part of the etch stop layer 166, part of the top electrode 142, part of the MTJ stack 140, part of the bottom electrode 138, and part of the IMD layer 130 to form a MTJ 148 on the MRAM region 114. Due to the characteristics of the IBE process, the top surface of the remaining IMD layer 130 is slightly lower than the top surface of the metal interconnections 132 after the IBE process and the top surface of the IMD layer 130 also reveals a curve or an arc. It should also be noted that as the IBE process is conducted to remove part of the IMD layer 130, part of the metal interconnection 132 could be removed at the same time to form inclined sidewalls on the surface of the metal interconnection 132 immediately adjacent to the MTJ 148.

Preferably, part of the hard mask 146 is still disposed on top surface of the first SOT layer 144 after the patterned hard mask 146 is used to form the MTJ 148, and then a cap layer 150 is formed on the surface of the IMD layer 130 on the MRAM region 114 and logic region 116. In this embodiment, the cap layer 150 preferably includes silicon nitride, but could also include other dielectric material including but not limited to for example silicon oxide, silicon oxynitride (SiON), or silicon carbon nitride (SiCN).

Figure 9:
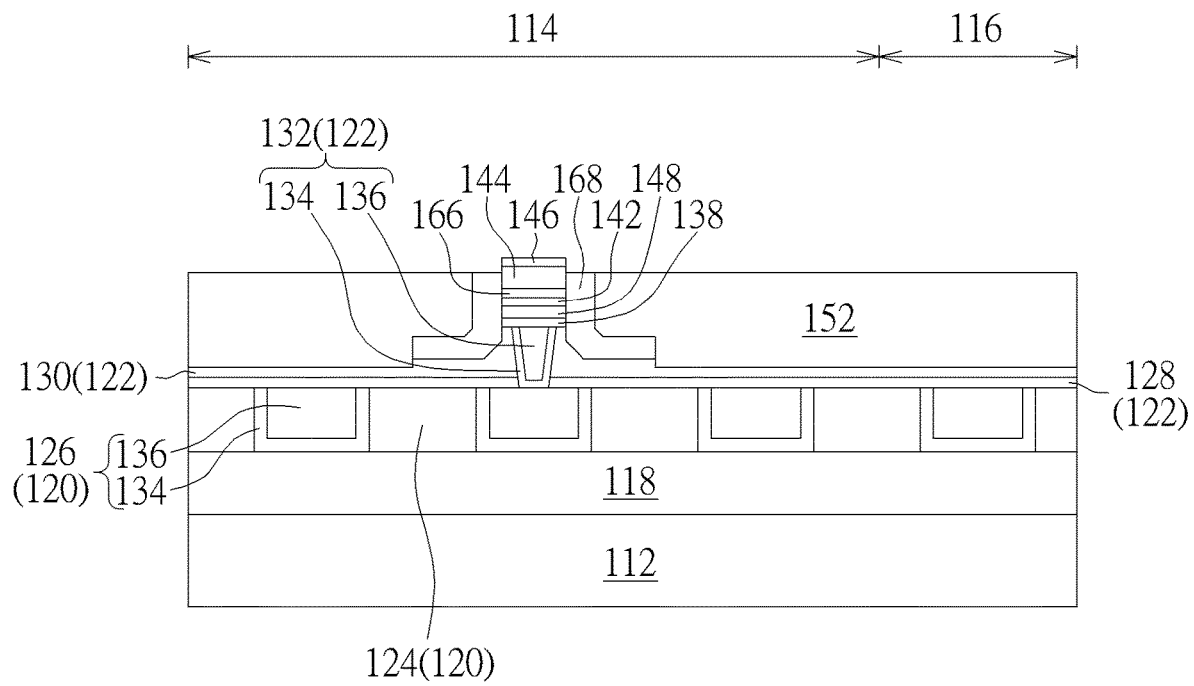

Next, as shown in FIG. 9, a photo-etching process is conducted by using a patterned mask (not shown) such as patterned resist as mask to remove part of the cap layer 150, and then a deposition process such as an atomic layer deposition (ALD) process is conducted to form an IMD layer 152 on the cap layer 150. It should be noted that when the cap layer 150 is patterned by the patterned mask, part of the IMD layer 130 underneath could also be removed at the same time so that sidewalls of the cap layer 150 are aligned with sidewalls of the IMD layer 130, which is also within the scope of the present invention.

Next, a planarizing process such as CMP could be conducted to remove part of the IMD layer 152 so that the top surfaces of the remaining IMD layer 152 and cap layer 150 are coplanar, and then an etching back process is conducted to remove part of the IMD layer 152 and part of the cap layer 150 at the same time. The remaining cap layer 150 then forms a spacer 168 adjacent to sidewalls of the MTJ 148, the etch stop layer 166, and the first SOT layer 144 as the top surfaces of the spacer 168 and the remaining IMD layer 152 are coplanar while the top surfaces of the spacer 168 and the IMD layer 152 are slightly lower than the top surface of the first SOT layer 144 but higher than the top surface of the etch stop layer 166. Viewing from another perspective, the first SOT layer 144 is protruding above the top surface of the IMD layer 152. It should be noted that even though a patterned mask is used to form a spacer 168 having substantially L-shape in the cross-section view, according to other embodiment of the present invention it would also be desirable to follow aforementioned embodiment to form a spacer having I-shape cross-section and in such instance, the top surface of the spacer could be even with the top surface of the first SOT layer 144 or top surface of the hard mask 146, which are all within the scope of the present invention.

Figure 10:
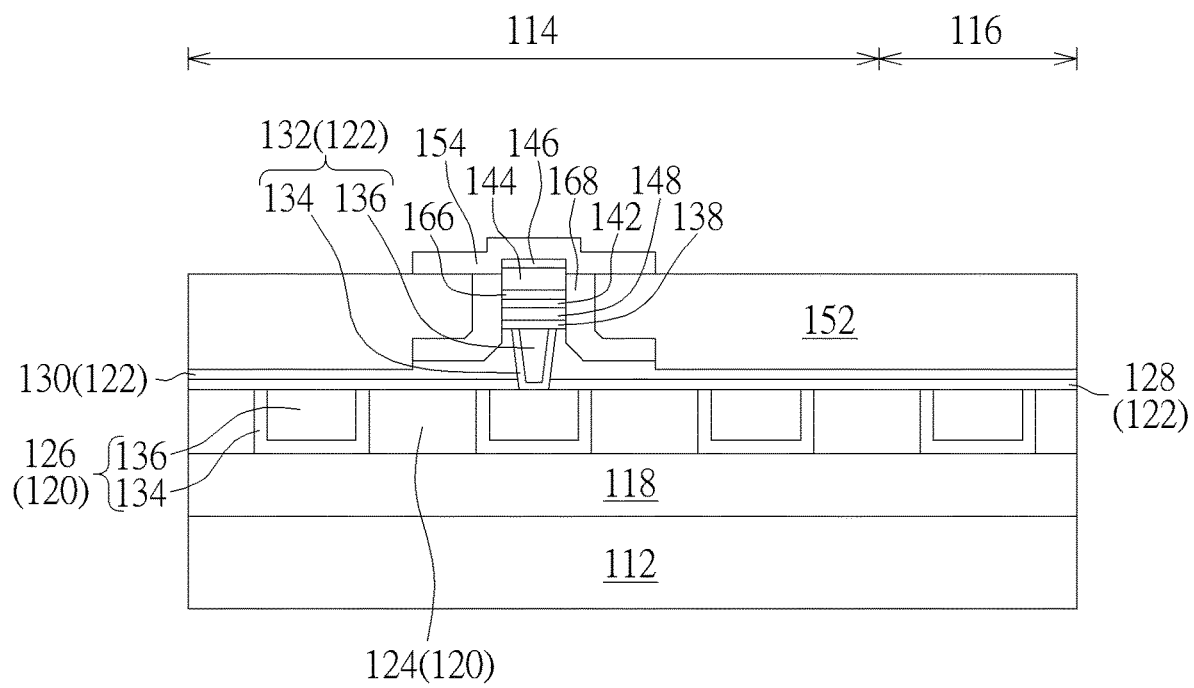

Next, as shown in FIG. 10, a second SOT layer 154 is formed on the surface of the first SOT layer 144, the spacer 168, and the IMD layer 152. Next, a pattern transfer or photo-etching process is conducted by using a patterned mask (not shown) as mask to remove part of the second SOT layer 154 on the IMD layer 152 as the remaining second SOT layer 154 is still disposed on the top surface of the hard mask 146, sidewalls of the first SOT layer 144, the top surface of the spacer 168, and the IMD layer 152 adjacent to two sides of spacer 168, in which sidewalls of the remaining second SOT layer 154 could be aligned with sidewalls of the spacer 168 underneath.

In this embodiment, the first SOT layer 144 and the second SOT layer 154 are preferably made of same material, in which the second SOT layer 154 also serves as the channel for MRAM device and the second SOT layer 154 could include metals such as tantalum (Ta), tungsten (W), platinum (Pt), or hafnium (Hf) and/or topological insulator such as bismuth selenide ($B_xSe_{1-x}$). Moreover, since the second SOT layer 154 formed at this stage is conformally formed on the top surface of the hard mask 146, sidewalls of the first SOT layer 144, and top surfaces of the spacer 168 and the IMD layer 152, the top surface of the second SOT layer 154 disposed directly on top of the IMD layer 154 is slightly lower than the top surface of the second SOT layer 154 disposed directly on top of the hard mask 146 or first SOT layer 144.

Figure 11:
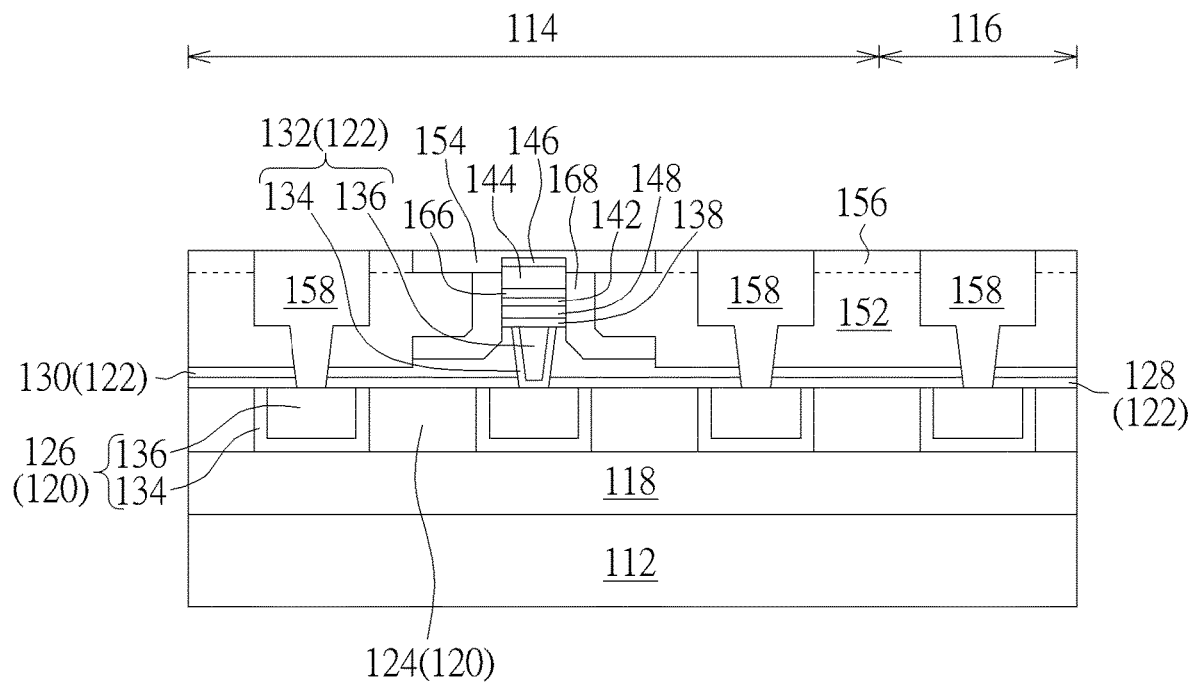

Next, as shown in FIG. 11, another IMD layer 156 is formed on the second SOT layer 154 and the IMD layer 152, in which the IMD layer 156 is preferably formed conformally on the second SOT layer 154. In this embodiment, each of the IMD layer 152 and IMD layer 156 preferably includes an ultra low-k (ULK) dielectric layer including but not limited to for example porous material or silicon oxycarbide (SiOC) or carbon doped silicon oxide (SiOCH). Next, a planarizing process such as chemical mechanical polishing (CMP) process or etching back process is conducted to remove part of the IMD layer 156 and even part of the second SOT layer 154 directly on top of the hard mask 146 so that the top surface of the remaining SOT layer 154 is even with the top surface of the IMD layer 156.

Next, a pattern transfer process is conducted by using a patterned mask (not shown) to remove part of the IMD layer 156, part of the IMD layer 152, part of the IMD layer 130, and part of the stop layer 128 on the MRAM region 114 and logic region 116 to form contact holes (not shown) exposing the metal interconnections 126 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the conductive materials including the aforementioned barrier layer and metal layer to form metal interconnections 158 in the contact holes electrically connecting the metal interconnections 126.

Figure 12:
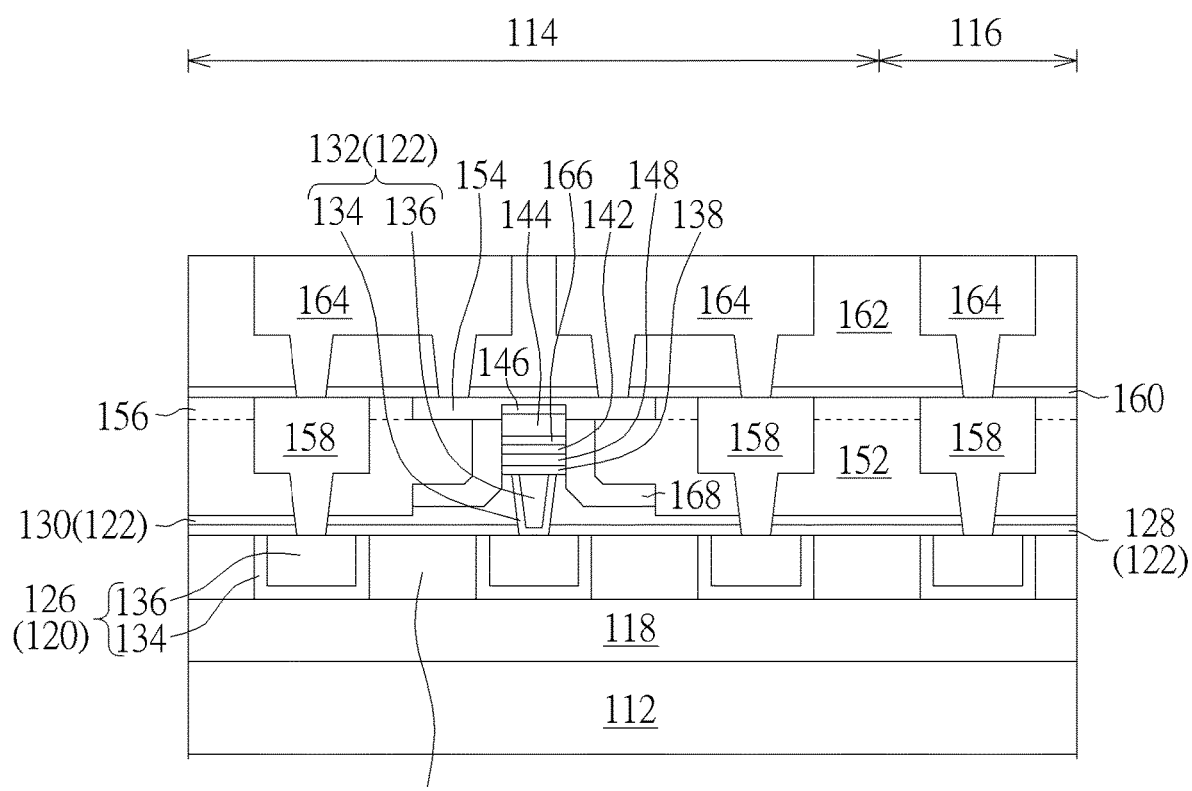

Next, as shown in FIG. 12, a stop layer 160 is formed on the MRAM region 114 and logic region 116 to cover the IMD layer 156 and metal interconnections 158, an IMD layer 162 is formed on the stop layer 160, and one or more photo-etching process is conducted to remove part of the IMD layer 162 and part of the stop layer 160 on the MRAM region 114 and logic region 116 to form contact holes (not shown). Next, conductive materials are deposited into each of the contact holes and a planarizing process such as CMP is conducted to form metal interconnections 164 connecting the MTJ 148 and metal interconnections 158 underneath, in which the metal interconnections 164 on the MRAM region 114 directly contacts the second SOT layer 154 underneath while the metal interconnections 164 on the logic region 116 directly contacts the metal interconnections 158 on the lower level.

In this embodiment, the stop layers 160 and 128 could be made of same or different materials, in which the two layers 160, 128 could all include nitrogen doped carbide (NDC), silicon nitride, silicon carbon nitride (SiCN), or combination thereof. Similar to the metal interconnections formed previously, each of the metal interconnections 164 could be formed in the IMD layer 162 through a single damascene or dual damascene process. For instance, each of the metal interconnections 164 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Figure 13:
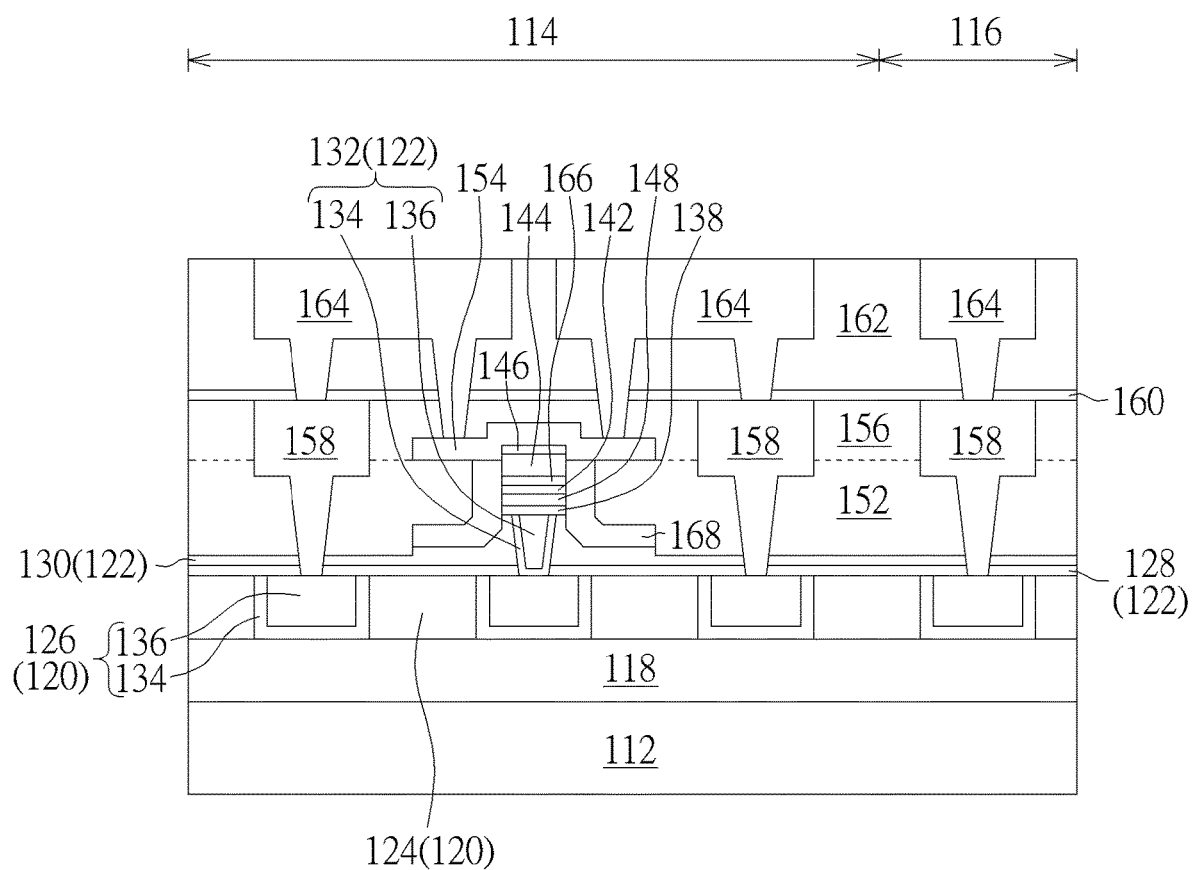
FIG. 13 illustrates a structural view of a MRAM deice according to an embodiment of the present invention.

Referring to FIG. 13, FIG. 13 illustrates a structural view of a MRAM deice according to an embodiment of the present invention. As shown in FIG. 13, it would also be desirable to form the IMD layer 156 as shown in FIG. 11 and then conduct a planarizing process to remove part of the IMD layer 156 without removing any of the second SOT layer 154 directly on top of the hard mask 146. In other word, after forming the IMD layer 156 the top surface of the second SOT layer 154 disposed on top surface of the IMD layer 152 is still lower than the top surface of the second SOT layer 154 directly on top of the hard mask 146 or first SOT layer 144, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a magnetic tunneling junction (MTJ) on a substrate;
   a first spin orbit torque (SOT) layer on the MTJ;
   a spacer adjacent to and directly contacting the MTJ and the first SOT layer, wherein top surfaces of the spacer and the first SOT layer are coplanar and a bottom surface of the spacer is lower than a bottom surface of the MTJ; and
   a second SOT layer on the first SOT layer, wherein the first SOT layer and the second SOT layer are made of same material.

2. The semiconductor device of claim 1, wherein the substrate comprises a magnetic random access memory (MRAM) region and a logic region, the semiconductor device comprising:
   a first inter-metal dielectric (IMD) layer on the substrate;
   a first metal interconnection in the first IMD layer on the MRAM region;
   the MTJ on the first metal interconnection;
   a second IMD layer around the spacer; and
   a second metal interconnection in the second IMD layer on the logic region.

3. The semiconductor device of claim 2, wherein a top surface of the second SOT layer is lower than a top surface of the second metal interconnection.

4. The semiconductor device of claim 1, wherein the spacer comprises an I-shape.

5. The semiconductor device of claim 2, further comprising:
   a stop layer on the second IMD layer;
   a third IMD layer on the stop layer;
   a third metal interconnection on the MRAM region to connect to the second SOT layer; and
   a fourth metal interconnection on the logic region to connect to the second metal interconnection.

* * * * *